US005985726A

United States Patent [19]

Yu et al.

[11] Patent Number: 5,985,726

[45] Date of Patent: Nov. 16, 1999

[54] DAMASCENE PROCESS FOR FORMING ULTRA-SHALLOW SOURCE/DRAIN EXTENSIONS AND POCKET IN ULSI MOSFET

[75] Inventors: Bin Yu, Fremont; Judy Xilin An, San Jose, both of Calif.

[73] Assignee: Advanced Micro Devices, Inc., Sunnyvale, Calif.

[21] Appl. No.: 09/187,635

[22] Filed: Nov. 6, 1998

[51] Int. Cl.[6] .................... H01L 21/336

[52] U.S. Cl. .................... 438/301; 438/183; 438/303; 438/305

[58] Field of Search .................... 438/176, 183, 438/217, 218, 221, 229, 230, 231, 232, 257, 259, 262, 263, 278, 289, 290, 291, 303, 305, 306, 321, 377, 699, 926, 264

[56] References Cited

U.S. PATENT DOCUMENTS

| | | | |
|---|---|---|---|
| 4,745,082 | 5/1988 | Kwok | 438/183 |
| 4,784,718 | 11/1988 | Mitani et al. | 438/183 |
| 5,264,382 | 11/1993 | Watanabe | 438/183 |
| 5,374,575 | 12/1994 | Kim et al. | 438/305 |
| 5,391,510 | 2/1995 | Hsu et al. | 438/305 |
| 5,429,956 | 7/1995 | Shell et al. | 438/305 |
| 5,675,159 | 10/1997 | Oku et al. | 257/284 |
| 5,716,861 | 2/1998 | Moslehi | 438/230 |
| 5,856,225 | 1/1999 | Lee et al. | 438/291 |
| 5,858,843 | 1/1999 | Doyle et al. | 438/183 |

FOREIGN PATENT DOCUMENTS

| | | |
|---|---|---|
| 3-248433 | 11/1991 | Japan . |
| 4-123439 | 4/1992 | Japan . |
| 5-160396 | 6/1993 | Japan . |

*Primary Examiner*—Charles Bowers
*Assistant Examiner*—Jack Chen
*Attorney, Agent, or Firm*—Foley & Lardner

[57] ABSTRACT

A method of fabricating an integrated circuit with ultra-shallow source/drain junctions utilizes a dummy or sacrificial gate structure. Dopants are provided through the openings associated with sacrificial spacers to form the source and drain extensions. The openings can be filled with spacers The process can be utilized for P-channel or N-channel metal oxide field semiconductor effect transistors (MOSFETS).

18 Claims, 4 Drawing Sheets

DAMASCENE PROCESS FOR FORMING ULTRA-SHALLOW SOURCE/DRAIN EXTENSIONS AND POCKET IN ULSI MOSFET

CROSS REFERENCE TO RELATED APPLICATIONS

This patent application is related to U.S. application Ser. No. 09/187,630 (Atty Docket No. 39153-117), by Yu, titled "Dual Amorphization Implant Process for Ultra-Shallow Drain and Source Extensions", U.S. application Ser. No. 09/187,890 (Atty Docket No. 39153-113) by Yu, et al., titled "A Method of Fabricating an Integrated Circuit with Ultra-Shallow Source/Drain Extensions", and U.S. application Ser. No. 09/187,172 (Atty Docket No. 39153-125), by Yu, titled "Recessed Channel Structure for Manufacturing Shallow Source Drain Extension", all filed on an even date herewith and assigned to the assignee of the present invention.

FIELD OF THE INVENTION

The present invention relates to integrated circuits and methods of manufacturing integrated circuits. More particularly, the present invention relates to a method of manufacturing integrated circuits having transistors with ultra-shallow source/drain extensions.

BACKGROUND OF THE INVENTION

Integrated circuits (ICs), such as, ultra-large scale integrated (ULSI) circuits, can include as many as one million transistors or more. The ULSI circuit can include complementary metal oxide semiconductor (CMOS) field effect transistors (FETS). The transistors can include semiconductor gates disposed between drain and source regions. The drain and source regions are typically heavily doped with a P-type dopant (boron) or an N-type dopant (phosphorous).

The drain and source regions generally include a thin extension that is disposed partially underneath the gate to enhance the transistor performance. Shallow source and drain extensions help to achieve immunity to short-channel effects which degrade transistor performance for both N-channel and P-channel transistors. Short-channel effects can cause threshold voltage roll-off and drain-inducted barrier-lowering. Shallow source and drain extensions and, hence, controlling short-channel effects, are particularly important as transistors become smaller.

Conventional techniques utilize a double implant process to form shallow source and drain extensions. According to the conventional process, the source and drain extensions are formed by providing a transistor gate structure without sidewall spacers on a top surface of a silicon substrate. The silicon substrate is doped on both sides of the gate structure via a conventional doping process, such as, a diffusion process or an ion implantation process. Without the sidewall spacers, the doping process introduces dopants into a thin region (i.e., just below the top surface of the substrate) to form the drain and source extensions as well as to partially form the drain and source regions.

After the drain and source extensions are formed, silicon dioxide spacers, which abut lateral sides of the gate structure, are provided over the source and drain extensions. The substrate is doped a second time to form the deeper source and drain regions. The source and drain extensions are not further doped due to the blocking capability of the silicon dioxide spacer.

As transistors disposed on integrated circuits (ICs) become smaller, transistors with shallow and ultra-shallow source/drain extensions have become more difficult to manufacture. For example, smaller transistors should have ultra-shallow source and drain extensions with less than 30 nanometer (nm) junction depth. Forming source and drain extensions with junction depths of less than 30 nm is very difficult using conventional fabrication techniques. Conventional ion implantation and diffusion-doping techniques make transistors on the IC susceptible to short-channeling effects, which result in a dopant profile tail distribution that extends deep into the substrate. Also, conventional ion implantation techniques have difficulty maintaining shallow source and drain extensions because point defects generated in the bulk semiconductor substrate during ion implantation can cause the dopant to more easily diffuse (transient enhanced diffusion, TED). The diffusion often extends the source and drain extension vertically into the bulk semiconductor substrate.

Thus, there is a need for a method of manufacturing ultra-shallow source and drain extensions that is not susceptible to transient enhanced diffusion. Further still, there is a need for transistors that have ultra-shallow junction source and drain extensions. Even further still, there is a need for an efficient method of manufacturing source and drain extensions.

SUMMARY OF THE INVENTION

The present invention relates to a method of manufacturing an integrated circuit. The method includes providing a gate structure between a source region and a drain region in a semiconductor substrate. The gate structure includes a dummy or sacrificial silicon gate material above a gate dielectric. The method also includes stripping the dummy silicon gate material, thereby leaving a cavity above the gate dielectric, forming a plurality of dielectric spacers in the cavity, providing a doped polysilicon material in the cavity between the dielectric spacers, removing the dielectric spacers, thereby leaving a plurality of openings, and providing a dopant at the location of the openings. The dopant at the openings forms source and drain extensions.

The present invention further relates to a method of manufacturing an ultra-large scale integrated circuit including a plurality of field effect transistors having shallow source and drain extensions. The method includes steps of forming at least part of a gate structure on a top surface of a semiconductor substrate, depositing an insulative material over the top surface of the semiconductor substrate, removing a dummy conductor material associated with the gate structure, providing a doped polysilicon material in the gate structure, and providing a dopant at a first location for a first spacer adjacent to the doped polysilicon material and at a second location for a second spacer adjacent to the doped polysilicon material, thereby forming shallow source and drain extensions.

The present invention further relates to a damascene gate process for forming a shallow source extension and a shallow drain extension. The process includes steps of forming a plurality of gate structures on a top surface of a substrate, stripping a first gate conductor from each of the gate structures, thereby leaving a cavity in the gate structure, forming a plurality of dielectric spacers in the cavity, providing a second gate conductor in the cavity between the dielectric spacers, removing the dielectric spacers, thereby leaving a plurality of openings, and providing a dopant through the openings to the substrate, thereby forming the shallow source extension and the shallow drain extension.

DETAILED DESCRIPTION OF THE PREFERRED EXEMPLARY EMBODIMENTS

Figure 1:
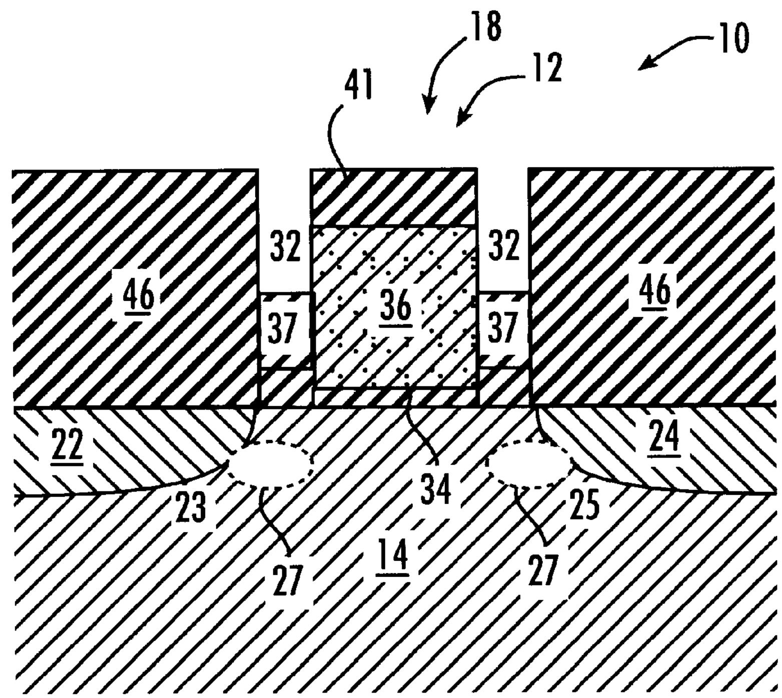
FIG. 1 is a cross-sectional view of a portion of an integrated circuit having a transistor with shallow source/drain extensions in accordance with an exemplary embodiment of the present invention.

With reference to FIG. 1, a transistor 12 is disposed on a semiconductor substrate 14, such as, a single crystal silicon wafer. Transistor 12 is part of a portion 10 of an integrated circuit (IC) manufactured on a wafer (such as, a silicon wafer). Transistor 12 includes a gate structure 18, a source region 22, and a drain region 24. Transistor 12 also includes a source extension 23 and a drain extension 25.

Extensions 23 and 25 are preferably ultra-shallow extensions (e.g., junction depth is less than 30 nanometers (nm)), which are thinner than regions 22 and 24. Extensions 23 and 25 are connected to regions 22 and 24, respectively, and are disposed partially underneath a gate oxide 34. Ultra-shallow extensions 23 and 25 help transistor 12 achieve substantial immunity to short-channel effects. Short-channel effects can degrade performance of transistor 12 as well as the manufacturability of the IC associated with transistor 12. Regions 22 and 24 and hence extensions 23 and 25 have a concentration of $10^{19}$ to $10^{20}$ dopants per cubic centimeter.

Pocket implant regions 27 are situated below extensions 23 and 25. Regions 27 are preferably doped opposite to extensions 23 and 25 at a concentration of $10^{18}$ dopants per cubic centimeter. Regions 27 are located 80 nm below a top surface 38 of substrate 14. Pocket implant regions 27 are provided below extensions 23 and 25 to prevent source/drain punch-through in depletion regions. Pocket region 27 are implanted to achieve additional immunity to short-channel effects. Regions 27 are preferably implanted by an ion implantation technique and include opposite dopants to the dopants utilized in regions 22 and 24. Accordingly, an appropriate dopant for an N-channel transistor is boron, boron diflouride, or iridium, and an appropriate dopant for pockets 27, of a P-type transistor is arsenic, phosphorous, or antimony.

Transistor 12 can be an N-channel or a P-channel field effect transistor, such as, a metal oxide semiconductor field effect transistor (MOSFET). Transistor 12 can be at least partially covered by an insulative layer 46 and is preferably part of an ultra-large scale integrated (ULSI) circuit that includes one million or more transistors.

Gate structure 18 includes a cap layer 41, spacer opening 32, gate oxide 34, and a polysilicon gate conductor 36. Spacer openings 32 can be filled with a silicon nitride ($Si_3N_4$) or silicone dioxide. Gate oxide 34 is preferably thermally grown on substrate 14. Conductor 36 is preferably deposited by chemical vapor deposition (CVD) and etched to form the particular structure for transistor 12. Spacers for openings 32 are preferably deposited by CVD and planarized or etched to leave the spacers in openings 32.

Structure 18 also includes thick oxide layer 37 disposed below openings 32. Similar to gate oxide 34, layer 37 is preferably thermally grown silicon dioxide having a thickness of 10–20 nm.

With reference to FIGS. 1–8, the fabrication of transistor 12, including source extension 23 and drain extension 25, in a damascene process, is described below as follows. The advantageous process allows source and drain extensions 23 and 25, respectively, to be annealed separately from other implants, such as, N-wells, P-wells, and regions 22 and 24. Therefore, a very small thermal budget can be used to form extensions 23 and 25, which is advantageous for forming shallow junction depths and a shallow profile for pocket implantation.

Figure 2:
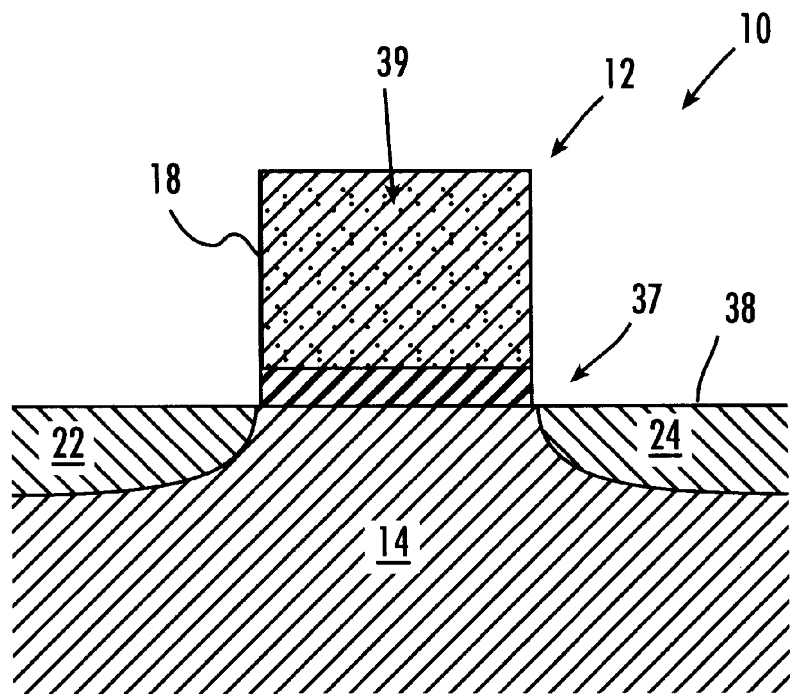
FIG. 2 is a cross-sectional view of the portion of the integrated circuit illustrated in FIG. 1, showing a gate structure with dummy gate material.

In FIG. 2, transistor 12 can be substantially formed by conventional semiconductor processing techniques to form gate structure 18, including a dielectric layer 37, dummy material 39, source region 22, and drain region 24. Substrate 14 is doped in an ion implantation process or diffusion process to form source region 22 and drain region 24. Regions 22 and 24 extend deeply below top surface 38 of substrate 14. Source region 22 and drain region 24 can be heavily doped with boron or phosphorous, depending upon the type of transistor 12. Alternatively, other dopants can be utilized.

Gate structure 18 includes dummy material 39, which is undoped polysilicon disposed over layer 37. Material 39 is deposited as a 100–200 nm layer that is selectively etched. Substrate 14 is subject to a rapid thermal annealing process to appropriately diffuse dopants within conductor substrate 14.

Figure 3:
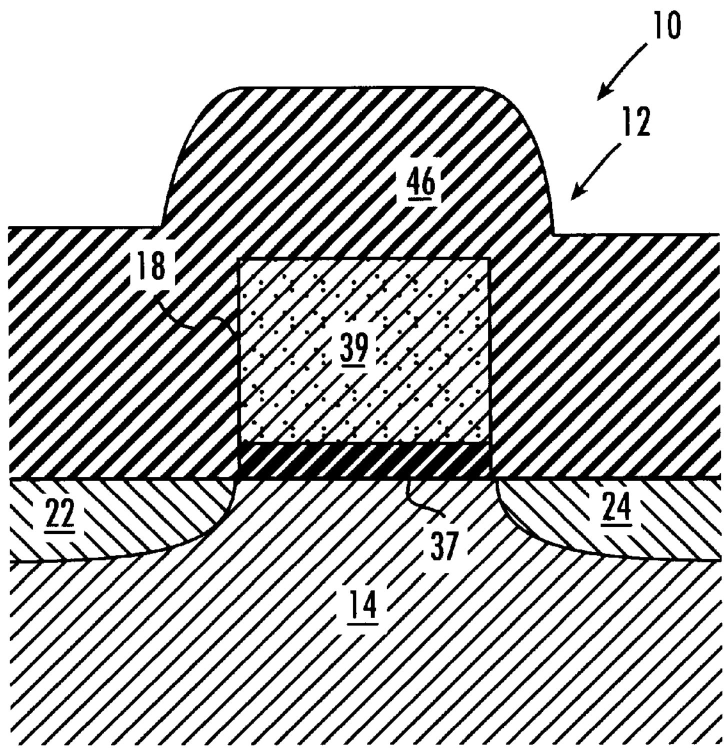
FIG. 3 is a cross-sectional view of the portion of the integrated circuit illustrated in FIG. 1, showing an oxide deposition step.

In FIG. 3, insulative layer 46 is provided over material 39 and substrate 14. Insulative layer 46 is preferably silicon dioxide deposited in a tetraorthosilicate (TEOS) process. Insulative layer 46 is initially 500–1000 nm thick.

Figure 4:
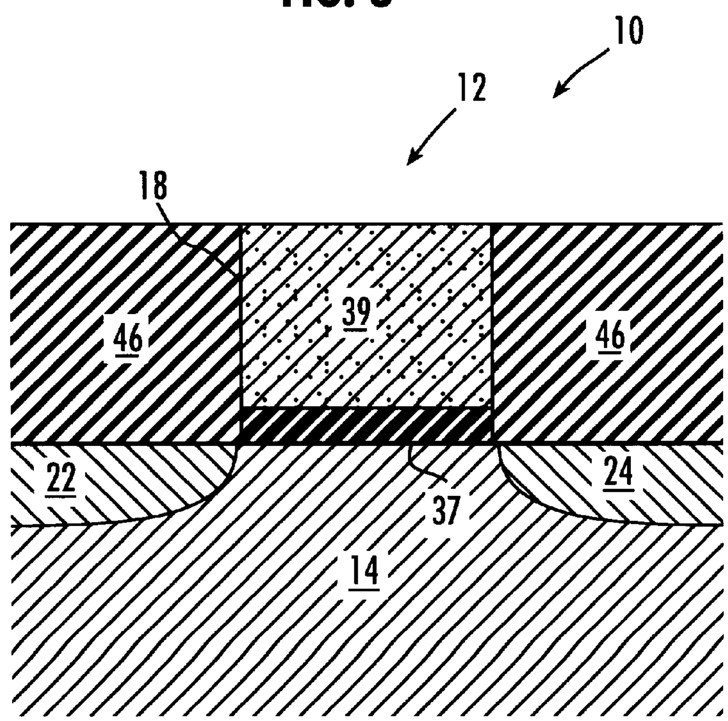
FIG. 4 is a cross-sectional view of the portion of the integrated circuit illustrated in FIG. 1, showing a chemical mechanical polish step.

In FIG. 4, layer 46 is subject to a chemical mechanical polish to expose material 39. The chemical mechanical polish preferably reduces the thickness of layer 46 to be approximately 100–200 nm.

Figure 5:
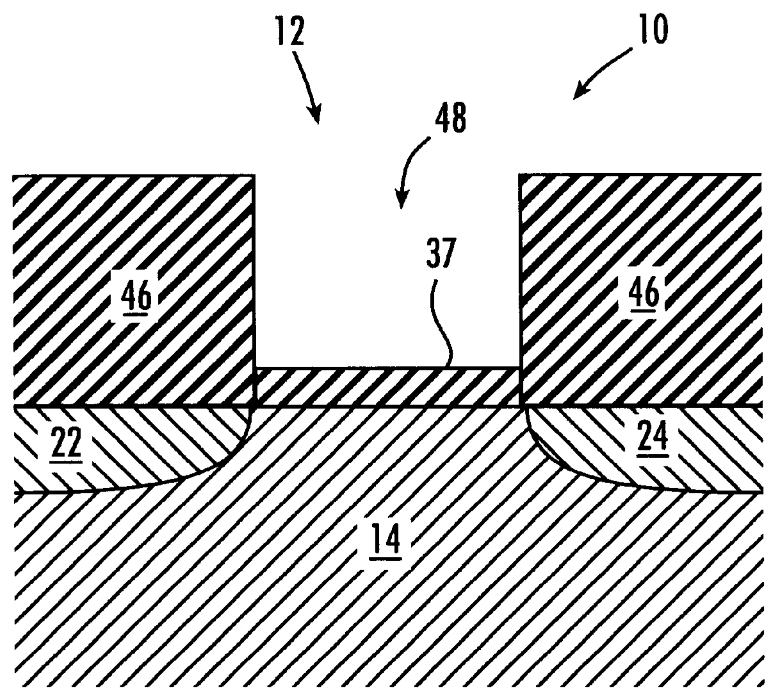
FIG. 5 is a cross-sectional view of the portion of the integrated circuit illustrated in FIG. 1, showing a wet chemical etching step.

In FIG. 5, after material 39 is exposed, material 39 is removed to leave a cavity 48 in structure 18 (FIG. 4). Material 39 is preferably removed by a chemical wet-etching process. The chemical wet-etching processing is preferably highly selective to polysilicon. Accordingly, layer 37 remains in cavity 48. Cavity 48 preferably is approximately 100–250 nm wide.

Figure 6:
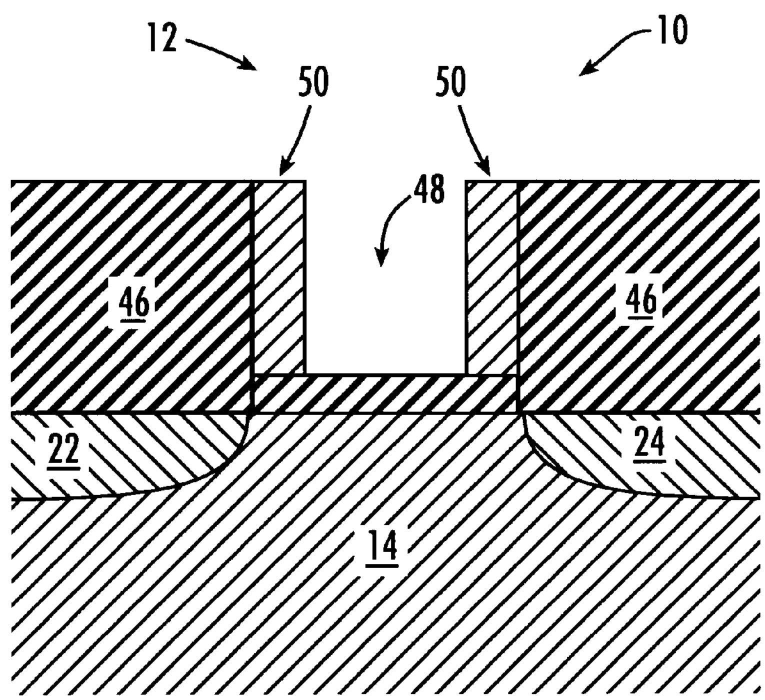
FIG. 6 is a cross-sectional view of the portion of the circuit illustrated in FIG. 1, showing a nitride spacer formation step.
Figure 7:
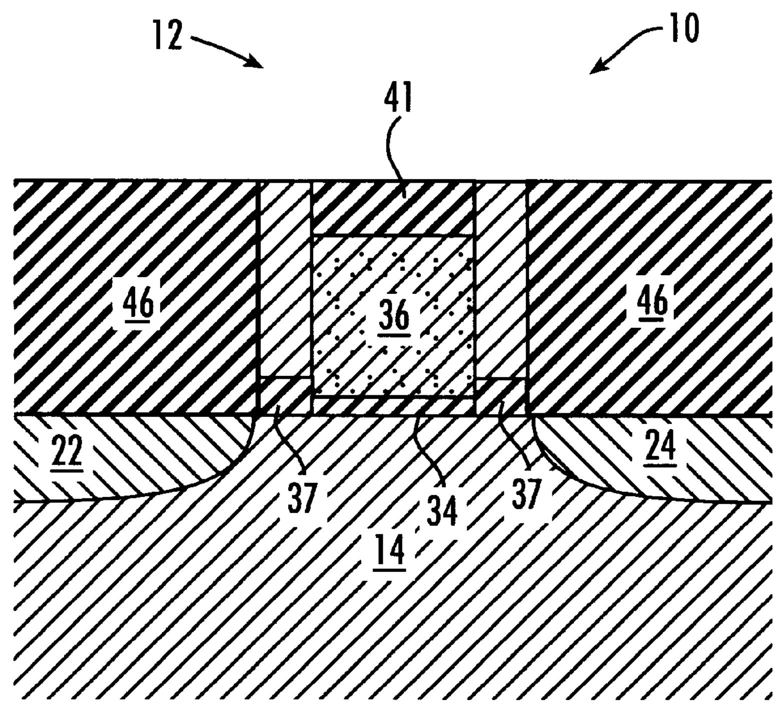
FIG. 7 is a cross-sectional view of the portion of the integrated circuit illustrated in FIG. 1, showing a doped polysilicon deposition step.

With reference to FIG. 6, spacers 50 are provided in cavity 48. Spacers 50 can be each approximately 20–50 nm wide. Spacers 50 are preferably sacrifical or dummy material which is provided as conformal nitride ($Si_3N_4$) layer and selectively etching the nitride layer to leave spacers 50. The nitride layer can be etched in a chemical wet-etch or in a dry-etch process. The nitride layer is deposited by plasma enhanced chemical vapor deposition (PECVD), or plasma vapor deposition (PVD), or CVD.

With reference to FIG. 6, layer 37 is removed from a bottom of cavity 48 to expose substrate 14. Layer 37 can be etched by a dry-etching process or a wet-etching process. However, layer 37 remains underneath spacers 50. After layer 37 is removed from the bottom of cavity 48, thin oxide layer 34 (FIG. 7) is thermally grown to a thickness of approximately 2–5 nm. Layer 37 is thicker than layer 34 to provide protection of substrate 14 when nitride layer of spacers 50 is selectively etched as described below.

Polysilicon material 36 is provided above oxide 34. Layer 36 is preferably 80 to 185 nm thick. Oxide layer 41 forms a cap that is preferably a 15–20 nm thick oxide layer formed by oxidation. Material 36 is preferably deposited in situ, as doped polysilicon material 36 can be deposited by CVD and selectively etched.

Figure 8:
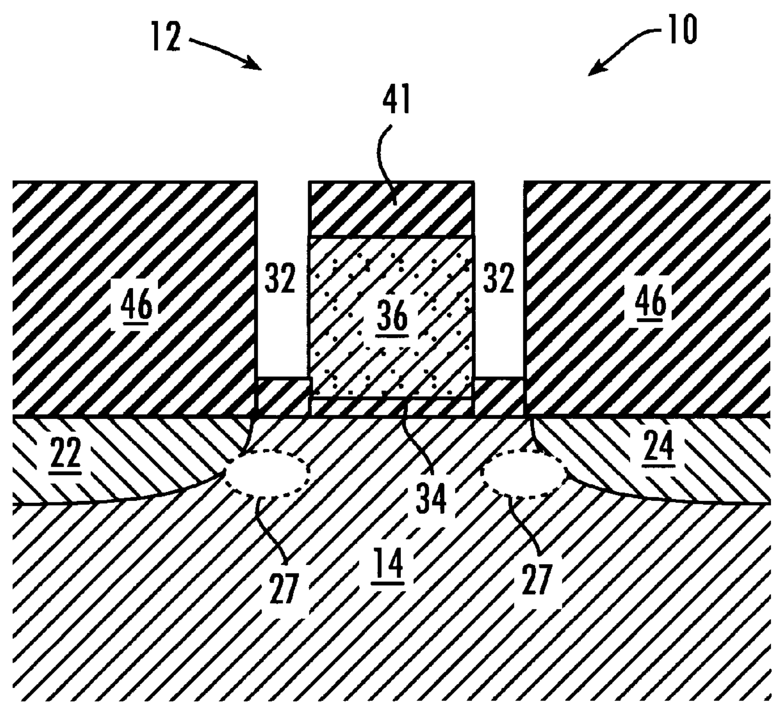
FIG. 8 is a cross-sectional view of the portion of the integrated circuit illustrated in FIG. 1, showing a pocket implantation step.

In FIG. 8, spacers 50 are removed by a chemical wet-etching process to leave openings 32. An ion implantation technique is utilized to form pocket regions 27. Pocket regions 27 are preferably formed in an ion implantation technique. Regions 27 are preferably between 50–80 nm below top surface 38 of substrate 14. The ion implantation technique can use devices manufactured by Varian Co. of Palo Alto, Calif.

With reference to FIG. 1, extensions 23 and 24 are formed by a ion implantation process. Preferably, a dopant which is the same as the dopant in regions 22 and 24 is deposited in an ion implantation where ions are charged up to 10–100 kiloelectron volts (keVs). Extensions 23 and 25 preferably have a thickness of less than 30 nm. After extensions 23 and 25 are provided, a conventional process can be utilized to complete transistor 12. For example, a conventional CMOS process can be utilized to form contacts and interconnects for transistor 12 as well as to fill in openings 32 with an oxide spacer. Further, layer 41 can be removed by an etching process.

It is understood that, while preferred embodiments, examples, materials, and values are given, they are for the purpose of illustration only. The apparatus and method of the invention are not limited to the precise details and conditions disclosed. For example, although wet-etching techniques are discussed, other methods could be utilized to remove structures. Thus, changes may be made to the details disclosed without departing from the spirit of the invention, which is defined by the following claims.

What is claimed is:

1. A method of manufacturing an integrated circuit, comprising:

providing a gate structure between a source region and a drain region in a semiconductor substrate, the gate structure including a dummy silicon gate material above a gate dielectric;

providing an insulative layer over the substrate;

stripping the dummy silicon gate material, thereby leaving a cavity in the insulative layer and above the gate dielectric;

forming a plurality of dielectric spacers in the cavity;

providing a doped polysilicon material in the cavity between the dielectric spacers;

removing the dielectric spacers, thereby leaving a plurality of openings; providing a pocket implant through the openings; and providing a dopant through the openings, thereby forming source and drain extensions, the source and drain extensions having a maximum depth being shallower than the source and drain regions.

2. The method of claim 1 further comprising:

providing on oxide cap over the doped polysilicon material.

3. The method of claim 2 wherein the removing step is a wet-etching step.

4. The method of claim 3, wherein the dielectric spacers are nitride.

5. The method of claim 1 wherein the insulative layer is an oxide layer.

6. The method of claim 5 further comprising:

planarizing the oxide layer and exposing the dummy silicon gate material via a chemical mechanical polish.

7. The method of claim 1 further comprising:

providing oxide spacers in the openings.

8. The method of claim 1, wherein the source and drain extensions have a depth of less than 30 nm from a top surface of the substrate.

9. The method of claim 6, wherein the oxide layer is less than 1 micron thick.

10. A method of manufacturing an ultra-large scale integrated circuit including a plurality of field effect transistors having shallow source and drain extensions, the method comprising steps of:

forming at least part of a gate structure on a top surface of a semiconductor substrate, the gate structure being between a deep source region and a deep drain region, the gate structure including a dummy material;

depositing an insulative material over the top surface of the semiconductor substrate;

removing the dummy material, thereby leaving a cavity in the insulative material;

providing a pair of dummy spacers in the cavity;

providing a doped polysilicon material in the gate structure;

removing the dummy spacers, thereby leaving a first hole and a second hole;

providing a pocket implant through the first hole and the second hole;

providing a dopant at a first location through the first hole adjacent to the doped polysilicon material and through the second hole adjacent to the doped polysilicon material, thereby forming shallow source and drain extensions, the source and drain extensions having a maximum depth shallower than the deep source region and the deep drain region.

11. The method of claim 10 further comprising:

providing an oxide spacer in the first hole and the second hole.

12. The method of claim 10, wherein a silicon dioxide cap is provided over the doped polysilicon material.

13. The method of claim 12, wherein the dummy spacers include silicon nitride material.

14. The method of claim 13, wherein the silicon nitride material is stripped in a wet-etching process.

15. A damascene gate process for forming a shallow source extension and a shallow drain extension, the process comprising steps of:

forming a plurality of gate structures on a top surface of a substrate, each of the gate structures being between deep source/drain regions and including a first gate conductor;

depositing an insulative layer over the top surface;

stripping the first gate conductor from the gate structures, thereby leaving a cavity in the insulative layer;

forming a plurality of dielectric spacers in the cavity;

providing a second gate conductor in the cavity between the dielectric spacers;

removing the dielectric spacers, thereby leaving a plurality of openings;

providing a pocket implant through the openings; and providing a dopant through the openings to the substrate, thereby forming the shallow source extension and the shallow drain extensions, the extensions having a maximum depth shallower than the deep source/drain regions.

16. The process of claim 15, wherein the dielectric spacers are silicon nitride.

17. The process of claim 16, wherein the second gate conductor is doped polysilicon.

18. The process of claim 16, wherein the spacers are nitride spacers.

* * * * *